(12) United States Patent
McIntyre et al.

(10) Patent No.: US 8,803,542 B2
(45) Date of Patent: Aug. 12, 2014

(54) METHOD AND APPARATUS FOR VERIFYING STITCHING ACCURACY OF STITCHED CHIPS ON A WAFER

(75) Inventors: Thomas J. McIntyre, Nokesville, VA (US); Charles N. Alcorn, Centreville, VA (US); Matthew A. Gregory, Woodbridge, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 748 days.

(21) Appl. No.: 13/112,745

(22) Filed: May 20, 2011

(65) Prior Publication Data
US 2011/0287367 A1    Nov. 24, 2011

Related U.S. Application Data

(60) Provisional application No. 61/346,591, filed on May 20, 2010, provisional application No. 61/346,593, filed on May 20, 2010, provisional application No. 61/346,598, filed on May 20, 2010, provisional application No. 61/346,601, filed on May 20, 2010.

(51) Int. Cl.
*G01R 31/02* (2006.01)
*G03F 7/20* (2006.01)

(52) U.S. Cl.
CPC ........ *G03F 7/70475* (2013.01); *G03F 7/70658* (2013.01)
USPC ............ 324/762.01; 324/762.03; 324/762.05; 430/30; 430/22

(58) Field of Classification Search
CPC combination set(s) only.
See application file for complete search history.

(56) References Cited

U.S. PATENT DOCUMENTS

| | | | | |
|---|---|---|---|---|
| 6,150,840 | A | * | 11/2000 | Patel et al. ...................... 326/41 |
| 6,225,013 | B1 | * | 5/2001 | Cohen et al. .................... 430/30 |
| 6,305,095 | B1 | * | 10/2001 | Look et al. ...................... 33/645 |
| 6,642,532 | B2 | * | 11/2003 | Kamijo ................... 250/492.22 |
| 6,962,762 | B2 | * | 11/2005 | Martin et al. ..................... 430/5 |
| 7,825,651 | B2 | * | 11/2010 | Amato ....................... 324/750.3 |
| 2004/0070740 | A1 | * | 4/2004 | Irie ................................. 355/52 |
| 2008/0209382 | A1 | * | 8/2008 | Dunham et al. ............... 716/11 |

* cited by examiner

*Primary Examiner* — Richard Isla Rodas
(74) *Attorney, Agent, or Firm* — Yudell Isidore Ng Russell; Antony P. Ng; Daniel J. Long

(57) ABSTRACT

A method for verifying stitching accuracy of a stitched chip on a wafer is disclosed. Initially, a set of test structures are inserted within a reticle layout. An exposure program is executed to control a photolithography equipment having a stepper to perform multiple exposures of the reticle on a wafer to generate a stitched chip on the wafer. Electrical measurements are then performed on the test structures at actual stitch boundaries of the stitched chip to evaluate stitching accuracy of the stitched chip.

14 Claims, 4 Drawing Sheets first chip segment       second chip segment first chip segment                    second chip segment first chip segment                    second chip segment

METHOD AND APPARATUS FOR VERIFYING STITCHING ACCURACY OF STITCHED CHIPS ON A WAFER

PRIORITY CLAIM

The present application claims priority under 35 U.S.C. §119(e)(1) to provisional application Nos. 61/346,591, 61/346,593, 61/346,598, 61/346,601, all filed on May 20, 2010, the contents of which are incorporated herein by reference.

STATEMENT OF GOVERNMENT INTEREST

The present invention was made with United States Government support under Contract number DTRA01-03-D-0007-002 awarded by the Defense Threat Reduction Agency. The Government has certain rights in the present invention.

BACKGROUND OF THE INVENTION

1. Technical Field

The present invention relates to reticles for semiconductor processing in general, and in particular to a method and apparatus for verifying stitching accuracy of stitched chips on a wafer.

2. Description of Related Art

During a typical chip fabrication, a field in a reticle is repeatedly exposed on different areas of a wafer until the entire photoresist layer has been exposed on the wafer. A stepper device is commonly utilized to move the reticle between exposures on the wafer.

The field of exposure is defined as the photoresist area exposed through one field at a time. Conventional photolithography equipment has a relatively small field of exposure. However, the desirable chip size of an image sensor tends to far exceed the limited field of exposure of conventional photolithography equipment. Thus, the size of a chip that can be manufactured on a single wafer is limited by the field of exposure of the photolithography equipment used to pattern the interconnect structures of the chip.

In order to make a larger chip on a single wafer, it is often necessary to stitch exposure fields together during the photolithography process. The accuracy of the stitching overlaps basically dictates how well the larger stitched chip will function. Because optical methods of verifying stitching accuracy can be somewhat subjective, it would be desirable to provide an improved method and apparatus for verifying stitching accuracy of a stitched chip on a single wafer.

SUMMARY OF THE INVENTION

In accordance with a preferred embodiment of the present invention, a set of test structures are inserted within a reticle layout. An exposure program is executed to control a photolithography equipment having a stepper to perform multiple exposures of the reticle on a wafer to generate a stitched chip on the wafer. Electrical measurements are then performed on the test structures at actual stitch boundaries of the stitched chip to evaluate stitching accuracy of the stitched chip.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1A:
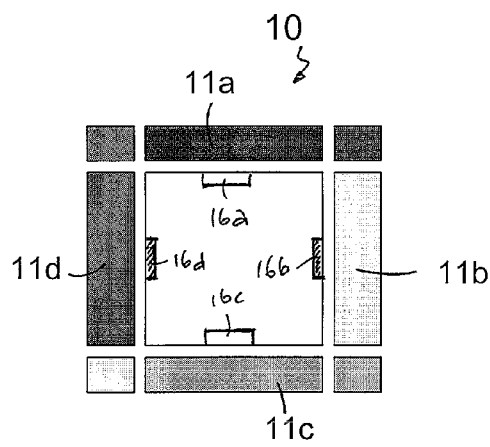
FIGS. 1a-1c illustrate the process of forming multiple stitched chips on a single wafer, in accordance with a preferred embodiment of the present invention.
Figure 1B:
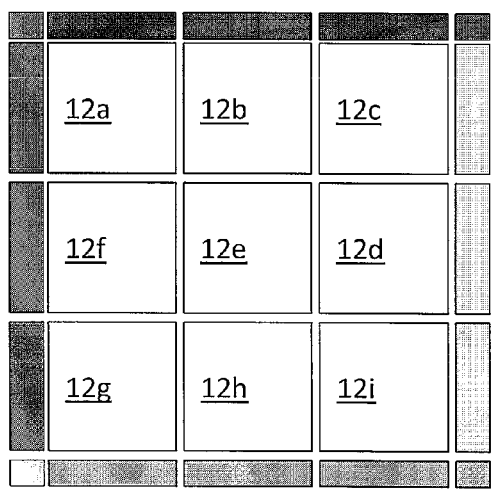
Figure 1C:
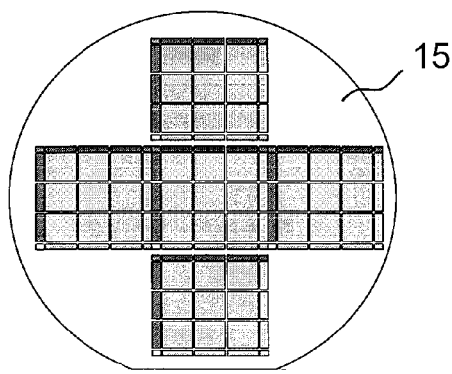

Referring now to the drawings and in particular to FIGS. 1a-1c, there are illustrated the process of forming multiple stitched chips on a single wafer, in accordance with a preferred embodiment of the present invention. As shown, a photomask (or reticle) 10 is initially designed for the purpose for forming a stitched chip, as shown in FIG. 1a. Photomask 10 generally includes edges 11a-11d. During exposure, some of edges 11a-11d will be "bladed off" to form a stitched chip 12 that constitutes chip segments 12a-12i, as depicted in FIG. 1b.

In the example shown in FIG. 1b, chip segment 12e is shown to have all its edges "bladed off" while other chip segments are shown to have at least two of their respective edges "bladed off" to form one complete stitched chip 12. More than one stitched chip 12 can be formed on a single wafer. For example, five identical copies of stitched chip 12 can be formed on a single wafer 15, as shown in FIG. 1c.

In accordance with a preferred embodiment of the present invention, multiple test structures are added to chip segment boundaries of a photomask, such as photomask 10, in order to assist the evaluations of stitching accuracy at the actual stitched boundaries (i.e., the boundaries where chip segments actually meet) of a stitched chip, such as stitched chip 12, on a wafer. For example, in FIG. 1a, a test structure 16a is added to a chip segment boundary adjacent to edge 11a, a test structure 16b is added to a chip segment boundary adjacent to edge 11b, a test structure 16c is added to a chip segment boundary adjacent to edge 11c, and a test structure 16d is added to a chip segment boundary adjacent to edge 11d. After edges have been "bladed off" for the purpose of forming an actual stitched boundary, the test structures located on respective chip segments will be in electrical contact with each other. For example, in FIG. 1b, test structure 16b of chip segment 12a should be in electrical contact with test structure 16d of chip segment 12b. Similarly, test structure 16c of chip segment 12b should be in electrical contact with test structure 16a of chip segment 12e.

Kelvin (4-wire) resistance measurements are then utilized to evaluate the stitching accuracy of each actual stitch boundary by precisely determining the resistances between test structure pairs located on separate chip segments. Different types of test structures are employed to assist the evaluations of stitching accuracy in X-directions and in Y-directions.

Figure 2A:
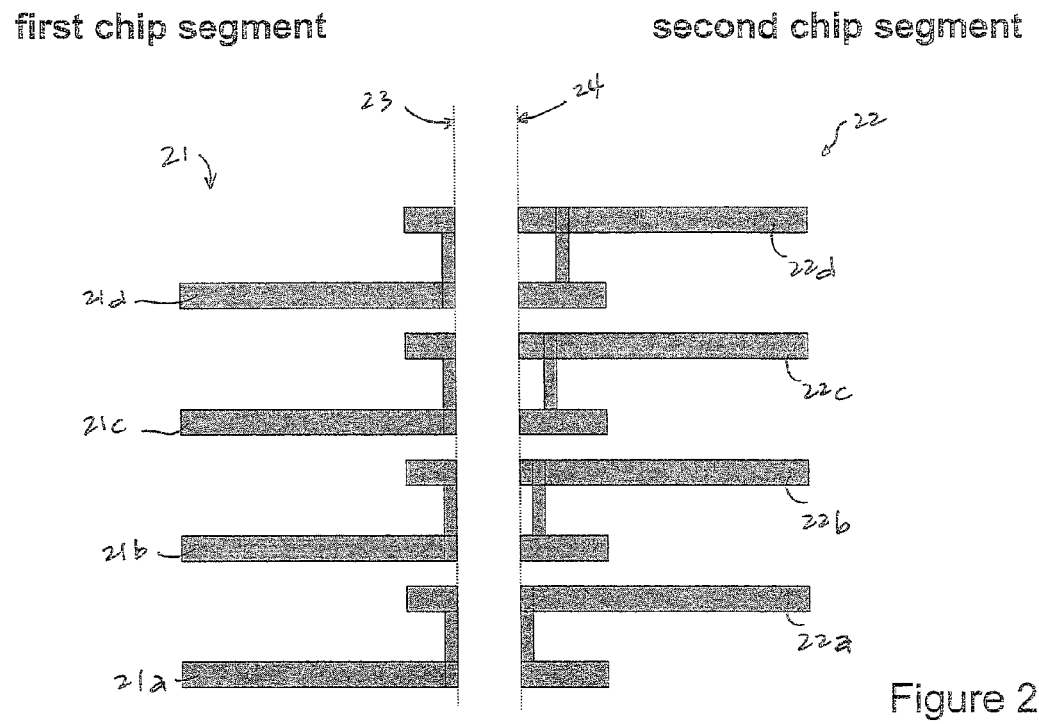
FIGS. 2a-2b show a set of test structures for assisting the evaluations of stitching accuracy in a X-direction of a stitched chip, in accordance with a preferred embodiment of the present invention.
Figure 2B:
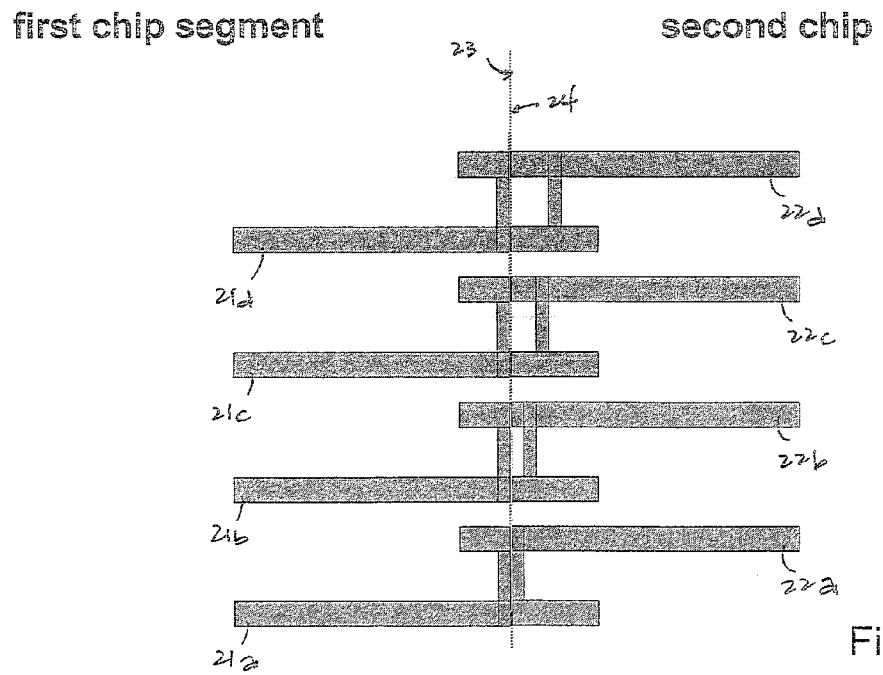

With reference now to FIGS. 2a-2b, there are illustrated a set of test structures for assisting the evaluations of stitching accuracy of a stitched chip in a X-direction, in accordance with a preferred embodiment of the present invention. As shown in FIG. 2a, a test structure 21 is located at a chip segment boundary 23 of a first chip segment, and a test structure 22 is located at a chip segment boundary 24 of a second chip segment. Test structure 21 includes electrically conductive sub-structures 21a-21d. Sub-structures 21a-21d are substantially identical to each other with an electrically conductive vertical segment connected between two electrically conductive horizontal segments. In addition, one of the edges of each vertical segment of sub-structures 21a-21d are flushed with chip segment boundary 23.

Similarly, test structure 22 includes electrically conductive sub-structures 22a-22d. Sub-structures 22a-22d are substantially identical to each other with an electrically conductive vertical segment connected between two electrically conductive horizontal segments. However, unlike sub-structures 21a-21d, only sub-structure 22a has its vertical segment flushed with chip segment boundary 24. The vertical segments of sub-structures 22b-22d are located at various distance from chip segment boundary 24, with sub-structure 22b being closest to chip segment 24 and sub-structure 22d being farthest from chip segment 24.

After the first and second chip segments have been stitched together (i.e., chip segment boundaries 23 and 24 are in alignment), as shown in FIG. 2b, Kelvin (4-wire) resistance measurements can be utilized to determine the resistance between different sub-structure pairs located on respective chip segments in order evaluate the stitching accuracy of the first and second chip segments in a X-direction. Specifically, Kelvin (4-wire) resistance measurements are performed on sub-structure pairs 21a:22a, 21b:22b, 21c:22c and 21d:22d. If the stitching of the first and second chip segments in a X-direction is sound, then the measured resistances of sub-structure pairs 21a:22a, 21b:22b, 21c:22c and 21d:22d should be from low (or zero) to high, accordingly.

Figure 3A:
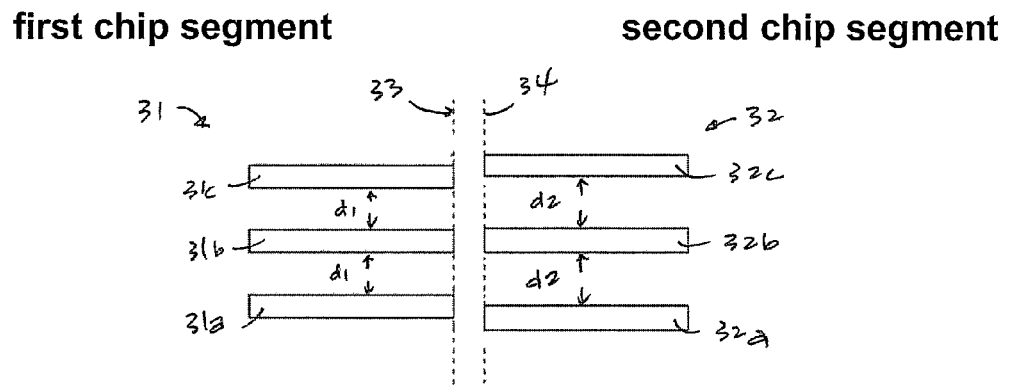
FIGS. 3a-3b show a set of test structures for assisting the evaluations of stitching accuracy in a Y-direction of a stitched chip, in accordance with a preferred embodiment of the present invention.
Figure 3B:
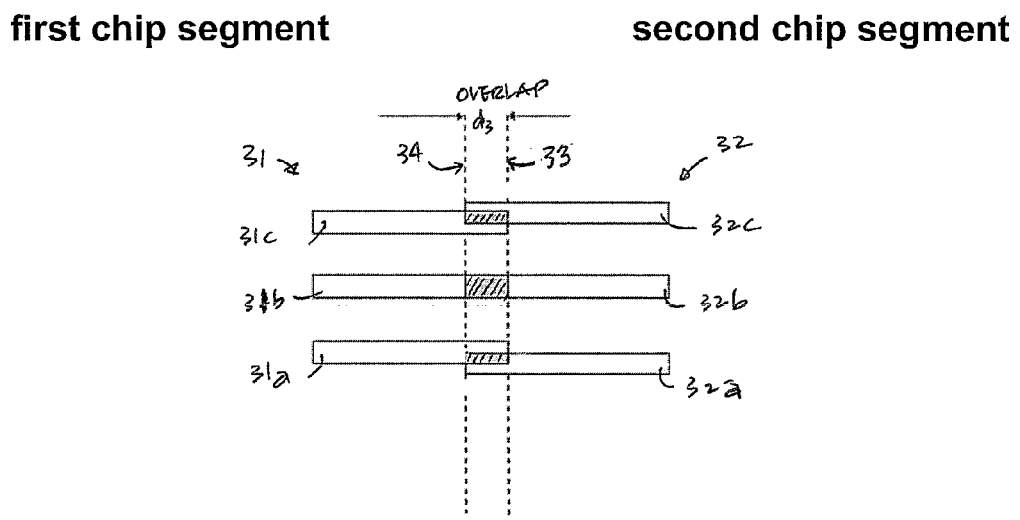

Referring now to FIGS. 3a-3b, there are illustrated a set of test structures for assisting the evaluations of stitching accuracy of a stitched chip in a Y-direction, in accordance with a preferred embodiment of the present invention. As shown in FIG. 3a, a test structure 31 is located at a chip segment boundary 33 of a first chip segment, and a test structure 32 is located at a chip segment boundary 34 of a second chip segment. Test structure 31 includes three electrically conductive horizontal bars 31a-31c that are substantially identical to each other. The distance between horizontal bars 31a and 31b is $d_1$, and the distance between horizontal bars 31b and 31c is also $d_1$.

Similarly, test structure 32 includes three electrically conductive horizontal bars 32a-32c that are substantially identical to each other. The distance between horizontal bars 32a and 32b is $d_2$, and the distance between horizontal bars 32b and 32c is also $d_2$ where $d_2$ is slightly larger than $d_1$.

After the first and second chip segments have been stitched together (i.e., chip segment boundary 34 crosses over chip segment boundary 33 with an overlap distance $d_3$), Kelvin (4-wire) resistance measurements can be utilized to determine the resistance between different horizontal bar pairs located on respective chip segments in order evaluate the stitching accuracy of the first and second chip segments in a Y-direction. Specifically, Kelvin (4-wire) resistance measurements are performed on sub-structure pairs 31a:32a, 31b:32b and 31c:32c. If the stitching of the first and second chip segments in a Y-direction is sound, then the measured resistances should be lowest for horizontal bar pair 31b:32b, but higher for horizontal bar pairs 31a:32a and 31c:32c, accordingly. In addition, the measured resistances for horizontal bar pairs 31a:32a and 31c:32c should be substantially the same.

The measured resistance for horizontal bar pair 31b:32b should be the lowest because horizontal bars 31b and 32b have the maximum overlap area. The measured resistance for horizontal bar pairs 31a:32a and 31c:32c should be higher because only part of the respective horizontal bar pairs overlap with each other. It is understood by those skilled in the art that the distance between horizontal bars 32a and 32b can be different from the distance between horizontal bars 32b and 32c to provide different resistance measurements for horizontal bar pair 31a:32a and for horizontal bar pairs 31c:32c.

Figure 4:
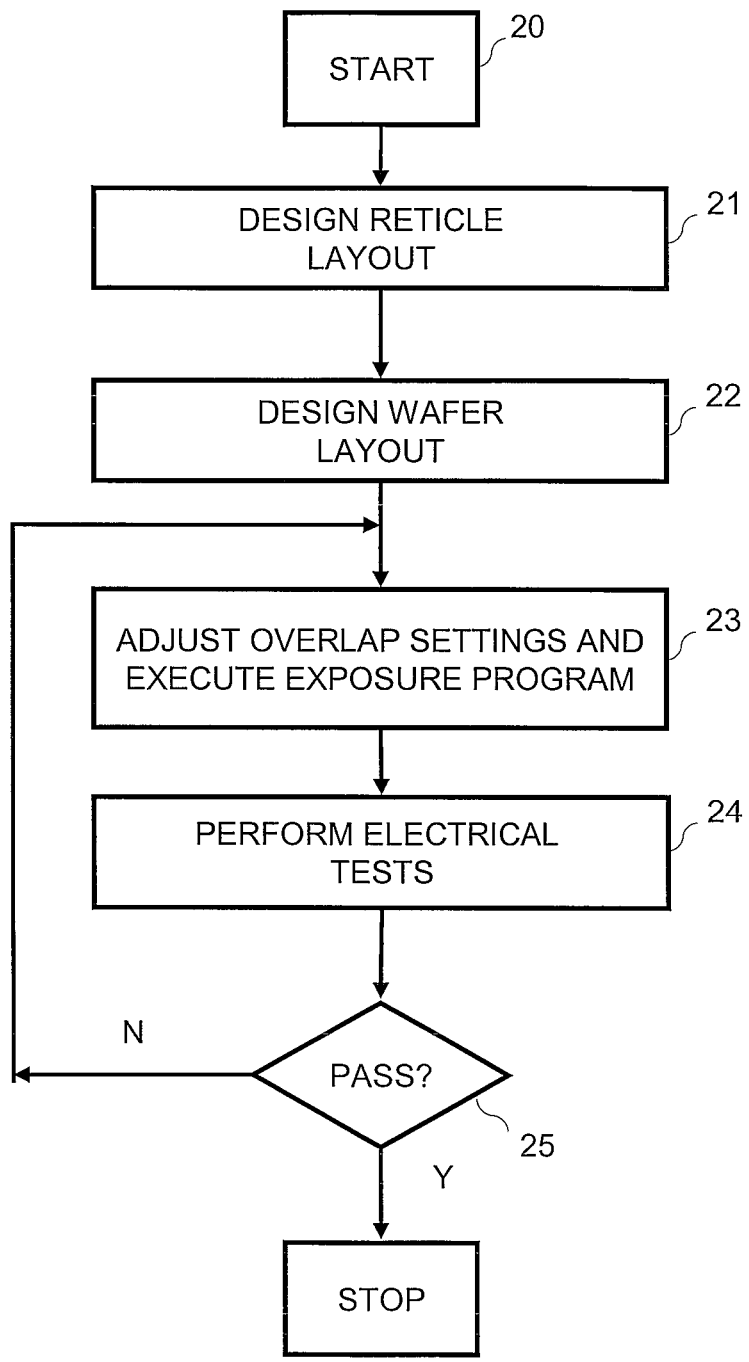
FIG. 4 is a flowchart of a method for verifying stitching accuracy of multiple stitched chips on a wafer, in accordance with a preferred embodiment of the present invention.

With reference now to FIG. 4, there is illustrated a flowchart of a method for verifying stitching accuracy of multiple chips on a wafer, in accordance with a preferred embodiment of the present invention. Starting at block 20, a reticle layout is initially designed, as shown in block 21. During the design process, proper overlaps for chip segments are included in the reticle. In addition, various test structures, such as test structures 21, 22 from FIG. 2a and test structures 31, 32 from FIG. 3a, are added to the chip segments for assisting the evaluation of stitching accuracy of a stitched chip. A wafer layout is then designed for the inclusion of multiple stitched chips, as depicted in block 22.

Next, overlap settings of a photolithography equipment having a stepper are adjusted, and an exposure program for controlling the photolithography equipment is then executed to perform multiple exposures on a wafer to generate a stitched chip on the wafer, as shown in block 23. Electrical tests, such as Kelvin (4-wire) resistance measurements, are subsequently performed on the test structures located on the stitched chip to evaluate the stitching accuracy of the stitched chip, as depicted in block 24. A determination is made whether or not the test structures pass the electrical tests, as shown in block 25. If the test structures do not pass the electrical tests, then the stepper parameters of the exposure program are adjusted and the exposure program is executed again, as shown in block 23, to generate another stitched chip.

As has been described, the present invention provides a method for verifying stitching accuracy of a stitched chip on a wafer.

It is also important to note that although the present invention has been described in the context of a fully functional computer system, those skilled in the art will appreciate that the mechanisms of the present invention are capable of being distributed as a program product in a variety of computer recordable type media such as compact discs and digital versatile discs.

While the invention has been particularly shown and described with reference to a preferred embodiment, it will be understood by those skilled in the art that various changes in form and detail may be made therein without departing from the spirit and scope of the invention.

What is claimed is:

1. A method for verifying stitching accuracy of a stitched chip on a wafer, said method comprising:
    inserting a plurality of test structures pairs in a reticle layout,
    wherein said test structure pairs for evaluating stitching accuracy of a stitched chip in a X-direction include a set of J structures located on a first chip segment, each J structure having two conductive bars orthogonally connected by one conductive bar located at a boundary of said first chip segment, and a set of H structures located on a second chip segment, each H structure having two conductive bars orthogonally connected by one conductive bar located at various distances from a boundary of said second chip segment, wherein said test structure pairs for evaluating stitching accuracy of said stitched chip in a Y-direction include a first set of three conductive bars located on said first chip segment, each conductive bar being spaced a first distance from each other, a second set of three conductive bars located on said second chip segment, each conductive bar being spaced a second distance from each other, wherein said second distance is larger than said first distance;

executing an exposure program to control a photolithography equipment having a stepper to perform multiple exposures of said reticle layout on a wafer to generate a stitched chip on said wafer; and performing electrical measurements on a set of stitched test structures produced using said test structures at actual stitch boundaries of said stitched chip to evaluate stitching accuracy of said stitched chip in said X-direction and said Y-direction.

2. The method of claim 1, wherein said performing further includes measuring resistances on said plurality of stitched test structure pairs at an actual stitched boundary where two chip segments meet.

3. The method of claim 1, wherein said performing further includes performing Kelvin 4-wire resistance measurements.

4. The method of claim 1, wherein said J structures resemble a letter "J".

5. The method of claim 4, wherein said H structures resemble a letter "H".

6. The method of claim 1, wherein said set of J structures are substantially identical to each other.

7. The method of claim 6, wherein said sets of conductive bars are substantially identical to each other.

8. A non-transitory computer-readable recording medium having a computer program product for verifying stitching accuracy of a stitched chip on a wafer, said non-transitory computer-readable recording medium comprising:

program code for inserting a plurality of test structures pairs in a reticle layout, wherein said test structure pairs for evaluating stitching accuracy of a stitched chip in a X-direction include a set of J structures located on a first chip segment, each J structure having two conductive bars orthogonally connected by one conductive bar located at a boundary of said first chip segment, and a set of H structures located on a second chip segment, each H structure having two conductive bars orthogonally connected by one conductive bar located at various distances from a boundary of said second chip segment, wherein said test structure pairs for evaluating stitching accuracy of said stitched chip in a Y-direction include a first set of three conductive bars located on said first chip segment, each conductive bar being spaced a first distance from each other, a second set of three conductive bars located on said second chip segment, each conductive bar being spaced a second distance from each other, wherein said second distance is larger than said first distance;

program code for executing an exposure program to control a photolithography equipment having a stepper to perform multiple exposures of said reticle layout on a wafer to generate a stitched chip on said wafer; and program code for performing electrical measurements on a set of stitched test structures produced using said test structures at actual stitch boundaries of said stitched chip to evaluate stitching accuracy of said stitched chip in said X-direction and said Y-direction.

9. The non-transitory computer-readable recording medium of claim 8, wherein said program code for performing further includes program code for measuring resistances on said plurality of stitched at an actual stitched boundary where two chip segments meet.

10. The non-transitory computer-readable recording claim 8, wherein said program code for performing further includes program code for performing Kelvin resistance measurements.

11. The non-transitory computer-readable recording of claim 8, wherein said J structures resemble a letter "J".

12. The non-transitory computer-readable recording medium of claim 11, wherein said H structures resemble a letter "H".

13. The non-transitory computer-readable recording medium of claim 8, wherein said set of J structures are substantially identical to each other.

14. The non-transitory computer-readable recording medium of claim 13, wherein said sets of conductive bars are substantially identical to each other.

* * * * *